US007233170B2

(12) United States Patent
Becker et al.

(10) Patent No.: US 7,233,170 B2
(45) Date of Patent: Jun. 19, 2007

(54) PROGRAMMABLE DRIVER DELAY

(75) Inventors: Wiren Dale Becker, Hyde Park, NY (US); Anand Haridass, Austin, TX (US); Bao G. Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 11/211,955

(22) Filed: Aug. 25, 2005

(65) Prior Publication Data

US 2007/0046335 A1    Mar. 1, 2007

(51) Int. Cl.
    *H03K 19/00*    (2006.01)
(52) U.S. Cl. .................. 326/93; 327/158; 327/161
(58) Field of Classification Search ............... 326/39, 326/93; 327/141, 155, 158, 161, 170
    See application file for complete search history.

(56) References Cited

U.S. PATENT DOCUMENTS

| 5,525,914 A | 6/1996 | Cao et al. ................. 326/71 |
| 6,147,525 A * | 11/2000 | Mitani et al. ............. 327/119 |
| 6,417,713 B1 | 7/2002 | DeRyckere et al. ......... 327/271 |
| 6,486,723 B1 | 11/2002 | DeRyckere et al. ......... 327/271 |
| 6,650,141 B2 | 11/2003 | Agrawal et al. ............ 326/41 |
| 6,803,872 B2 | 10/2004 | DeRyckere et al. ......... 341/160 |
| 6,834,255 B2 * | 12/2004 | Abrosimov et al. ........ 702/181 |
| 6,891,394 B1 | 5/2005 | Yu et al. ..................... 326/38 |
| 6,943,602 B1 * | 9/2005 | Lee ............................ 327/158 |
| 2001/0040902 A1 | 11/2001 | Rao .......................... 370/519 |
| 2002/0175728 A1 | 11/2002 | DeRyckere et al. ......... 327/271 |
| 2002/0175730 A1 | 11/2002 | DeRyckere et al. ......... 327/277 |
| 2004/0133374 A1 | 7/2004 | Kattan ....................... 702/85 |

* cited by examiner

*Primary Examiner*—Rexford Barnie
*Assistant Examiner*—Jason Crawford
(74) *Attorney, Agent, or Firm*—Winstead PC

(57) ABSTRACT

Data busses are configured as N differential channels driven by a data signal and its complement through two off-chip drivers (OCDs). Each OCD is preceded by a programmable delay element and a two way MUX. The two data channels either transmit the data signals or a common clock signal as determined by a select signal from a skew controller. The differential signals are received in a differential receiver and a phase detector. The output of the phase detector in each differential channel is routed through an N×1 MUX. The N×1 MUX is controlled by the skew controller. The output of the N×1 MUX is fed back as a phase error feedback signal to the skew controller. Each differential data channel is sequentially selected and the programmable delays are adjusted until the phase error feedback signal from the selected phase detector reaches a predetermined minimum allowable value. Periodic adjustment may be implemented for calibration.

20 Claims, 11 Drawing Sheets

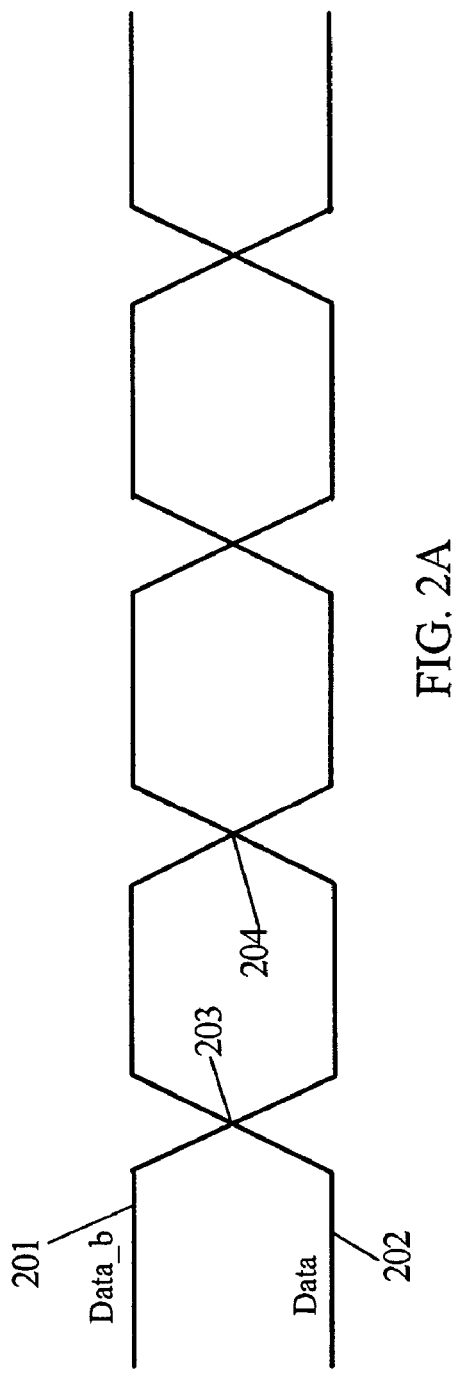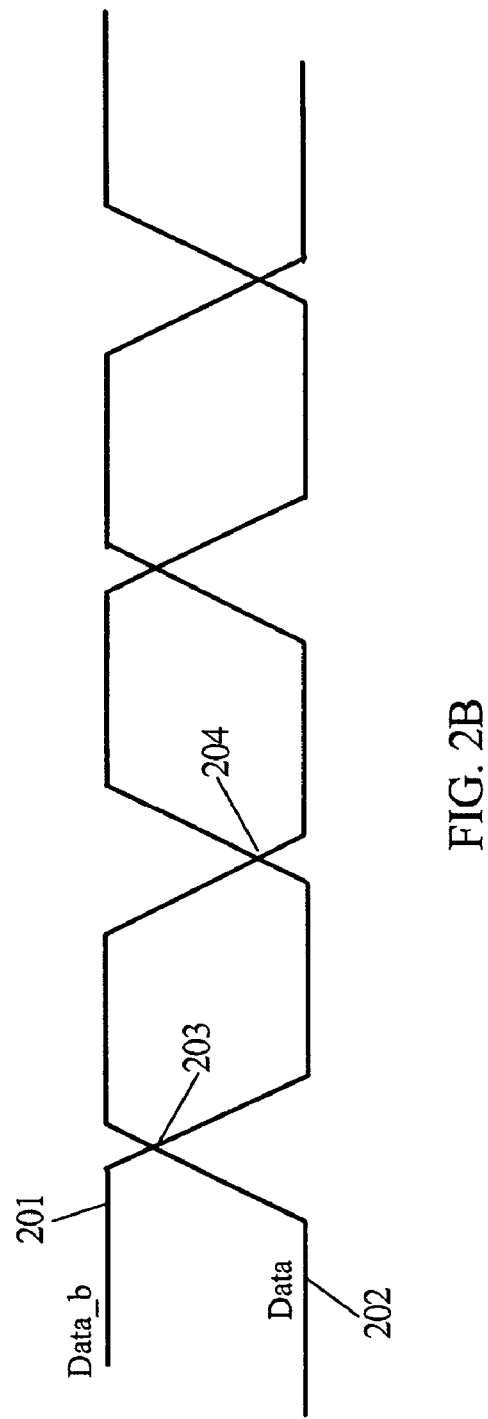

state 1: first delay signal lags second delay signal state 2: first delay signal leads second delay signal state 3: first delay signal is in phase with the second delay signal state 4: phase difference indeterminate

PROGRAMMABLE DRIVER DELAY

TECHNICAL FIELD

The present invention relates in general to board level transmission line drivers and receivers, and in particular, to methods for compensating for timing skew between differential data channels.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (cross talk) affects signal quality. One way to alleviate the detrimental effects of noise and coupling is through the use of differential signaling. Differential signaling comprises sending a signal and its compliment to a differential receiver. In this manner, noise and coupling affect both the signal and the compliment equally. The differential receiver only senses the difference between the signal and its compliment as the noise and coupling represent common mode signals. Therefore, differential signaling is resistant to the effects that noise and cross talk have on signal quality. On the negative side, differential signaling increases pin count by a factor of two for each data line. Additionally, an empty wiring channel is usually added between each differential channel which further adds to the wiring inefficiency.

The structure of a printed circuit board (PCB) is sometimes not homogeneous. It is common to find a weave structure on many laminates as shown in FIG. 1. Given the space between the components of a differential pair and the weave structure of PCBs, it is possible to find differential pairs with an orientation as shown in FIG. 1 where the exemplary signal traces Data 103 and Data_b 105 do not have the same substrate configuration. In one case, the signal trace Data 103 has a dielectric substrate comprising the continuous fiberglass strand material 102. In the other case, the signal trace Data_b has a dielectric substrate comprising fiberglass strands 101 in one direction and an epoxy fiberglass mix 104 in between the channels of fiberglass strands 101. This results in the transmission lines formed by the signal traces having differing relative permittivities which results in the transmission lines having differing propagation delays.

A differential pair having a signal and complement signal transmitted over matched transmission lines would have a received signal waveform substantially represented by the waveforms of FIG. 2A where the transition cross over points 203 and 204 are symmetrical. However, if the two transmission lines had different propagation delays, the resulting waveforms may look like the waveforms of FIG. 2B where the transition cross over points 203 and 204 are no longer symmetrical and occur at differing voltage levels resulting in timing skew between the two signals when detected in a differential receiver.

With net lengths of tens of centimeters, differential skew delays due to PCB laminate weaves may approach tens of picoseconds. Presently transmission data rates of 10 gigabits per second means a bit width of only 100 picoseconds. Clearly, tens of picoseconds of in-pair timing skew for differential pairs is not negligible for these high data rates. In-pair differential skew may cause asymmetric crossover and aggravate common mode sensitivities. One solution that is been proposed is to use a diagonal trace pattern as shown in FIG. 3 where signal traces Data 301 and Data_b 302 are run at a diagonal with respect to the orthogonal strands 101 and 102. See U.S. Pat. No. 6,304,700 and U.S. Patent Application 2004/0181764. This solution allows both signal traces Data 301 and Data_b 302 to have an equal mix of substrate composition. While this may be an improvement of FIG. 1, adhering to this configuration may make wiring rules difficult.

There is, therefore, a need for a signaling scheme that enables the skew between differential data channels to be compensated without complicating layout rules. The scheme must be programmable and easy to implement and modify.

SUMMARY OF THE INVENTION

The present invention uses two single ended off-chip drivers (OCD) to implement differential signal by having each data path transmit a data signal and its complement. Each of the OCDs is preceded by a programmable delay element. The input to the delay elements are coupled to the output of a two-input multiplexer (MUX) that receives the data signal for the path and a common clock signal. Under control of a select signal, either a data signal or a common clock signal is coupled to the data path comprising a transmission lines over the non-homogeneous PCB substrate. Each of the transmission lines is terminated in a suitable terminator and received in one input of a differential receiver. The two inputs to the differential receiver are also coupled to a phase detector whose output is coupled to the input of a N×1 MUX. Skew control logic generates the select signals for the driver side MUXes as well as the select signal for the receiver side N×1 MUX. The output of the N×1 MUX is coupled as a feedback error signal to the skew control logic in a single feedback channel which is used to align each differential data channel.

To align the differential data channels, each differential data channel is selected in sequence by coupling the common clock signal to the drivers of the two transmission lines and selecting the phase detector for that channel as the output of the N×1 MUX. The skew control logic then adjusts the delays in series with each driver until the phase detector output measures a predetermined amount of phase shift or delay error. Then a next differential data channel is selected and the process is repeated until all the delays for the differential data channels are set to minimize the inter-channel timing skew.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates waveforms of ideal matched differential signals; and

FIG. 2B illustrates waveforms of differential signals with unequal delay causing timing skew;

DETAILED DESCRIPTION

Figure 1:
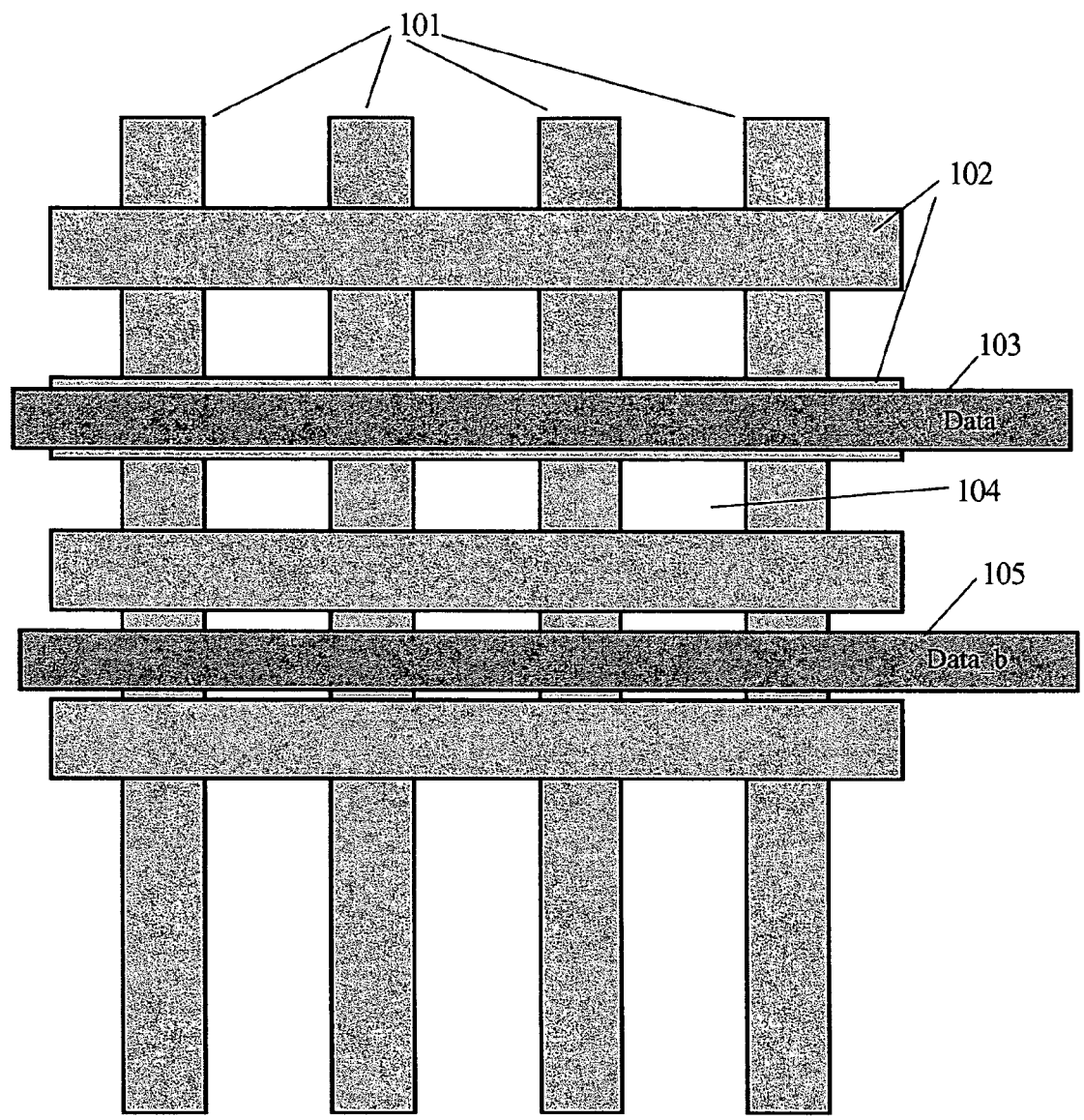
FIG. 1 illustrates signal traces on a PCB with orthogonal strands of fiberglass.
Figure 3:
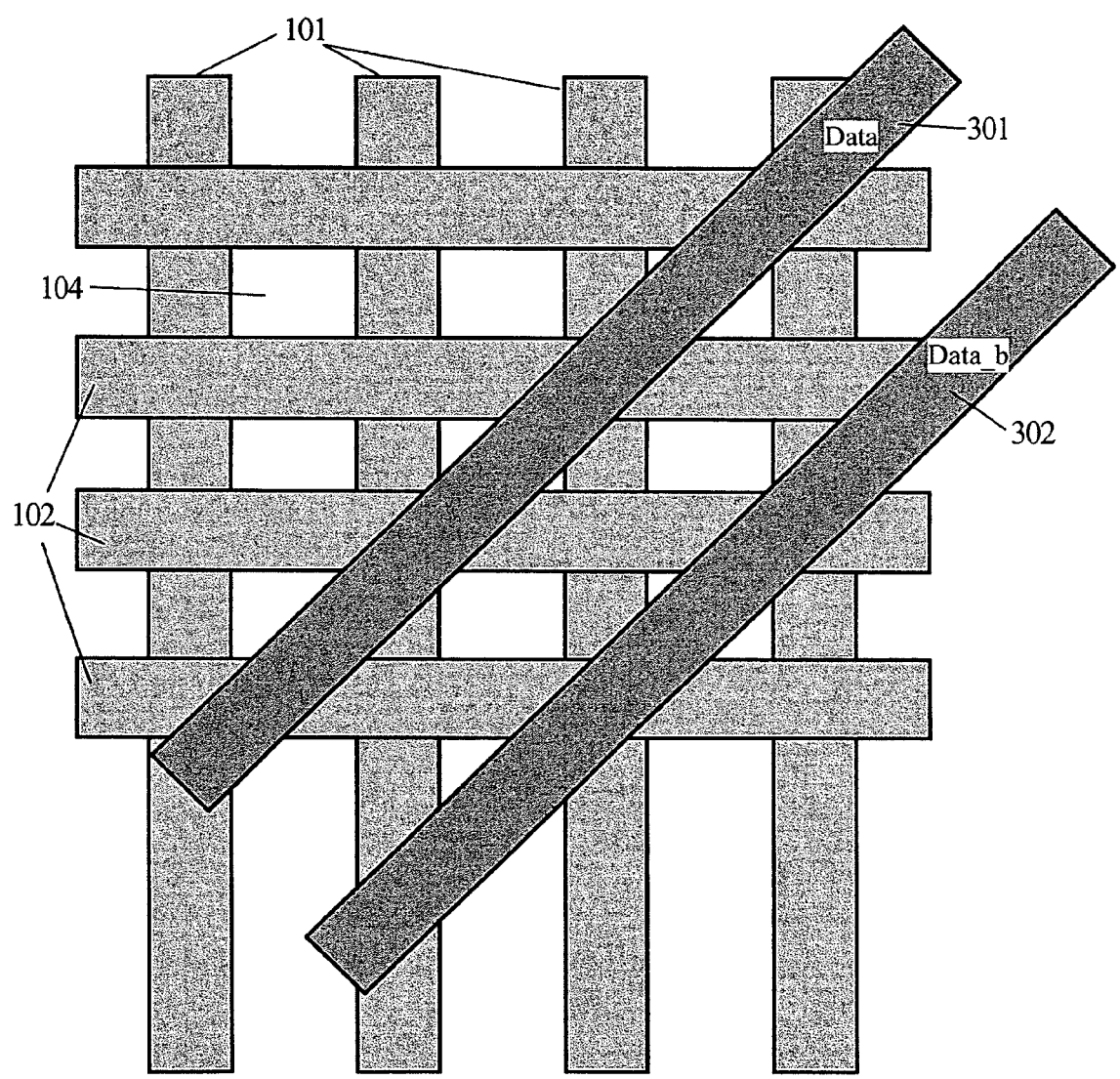
FIG. 3 illustrates a prior art diagonal signal trace pattern to reduce delay differences.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views. In the following, data channel refers to a single transmission path and differential data channel refers to a pair of transmission paths. Each differential data channel comprises transmission paths for a logic signal and the complement of the logic signal coupled to a single differential receiver.

Figure 4:
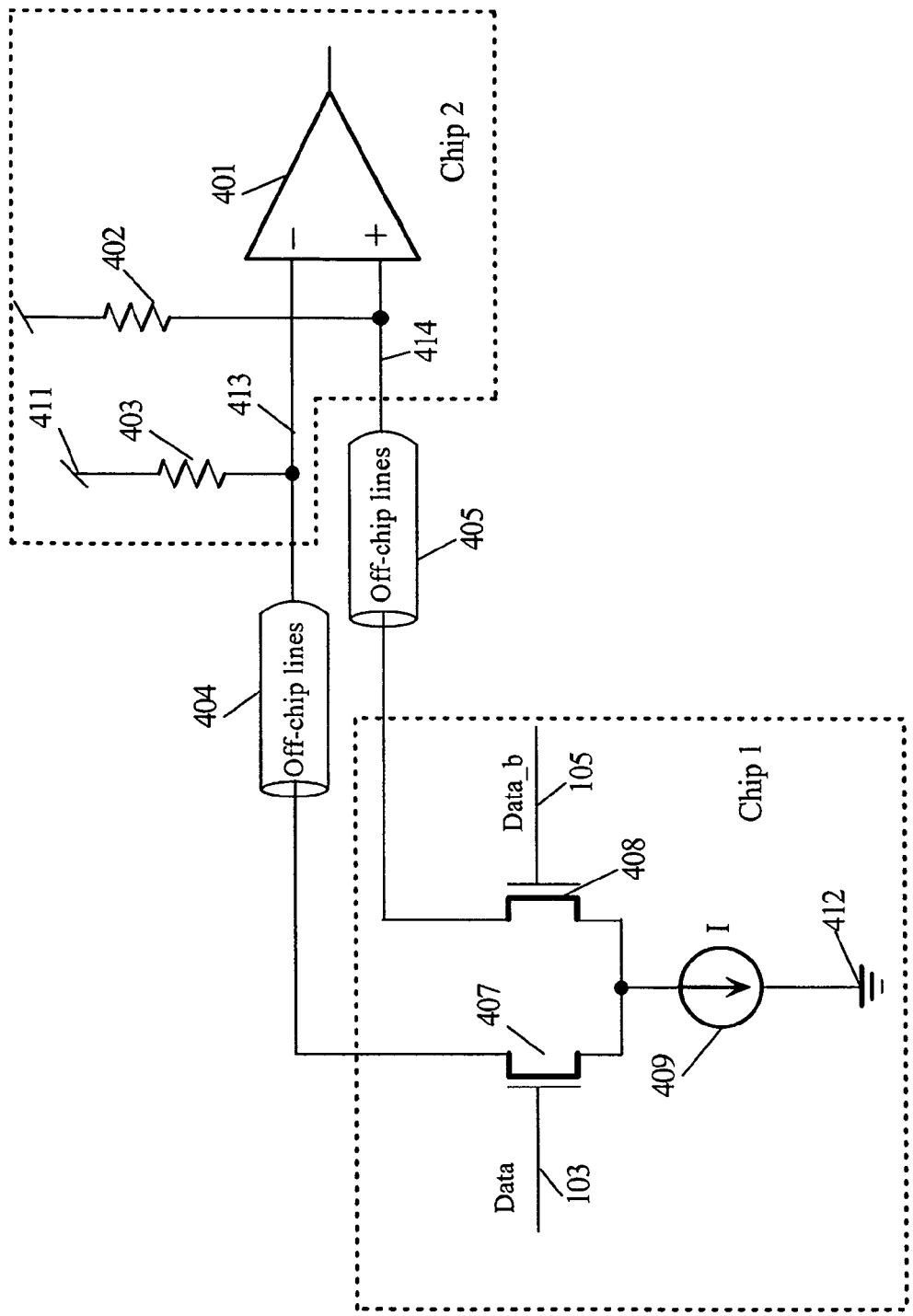
FIG. 4 is a circuit diagram illustrating a current steering circuit for differential signaling.

FIG. 4 is a circuit diagram of a current steering circuit for realizing differential signaling. Current source 409 supplies a constant current to field effect transistors (FETs) 407 and 408. When Data 103 is a logic one and Data_b 105 is a logic zero, FET 407 is turned ON and FET 408 is turned OFF. The current 409 flows through transmission line 404 and resistor 403 and pulls node 413 to a logic zero. Since FET 408 is OFF, resistor 402 and power supply voltage 411 pulls node 414 to a logic one. Therefore, the output of differential receiver 401 is a logic one corresponding to the value of Data 103. When Data_b 105 is a logic one and Data 103 is a logic zero, the input logic states of nodes 413 and 414 reverse. The current 409 now flows through transmission line 405 and resistor 402 and pulls node 414 to a logic zero. FET 407 is OFF, thus resistor 403 and power supply voltage 411 pulls node 413 to a logic one. In this case, the output of differential receiver 401 is a logic zero corresponding to the value of Data_b 105.

Figure 5:
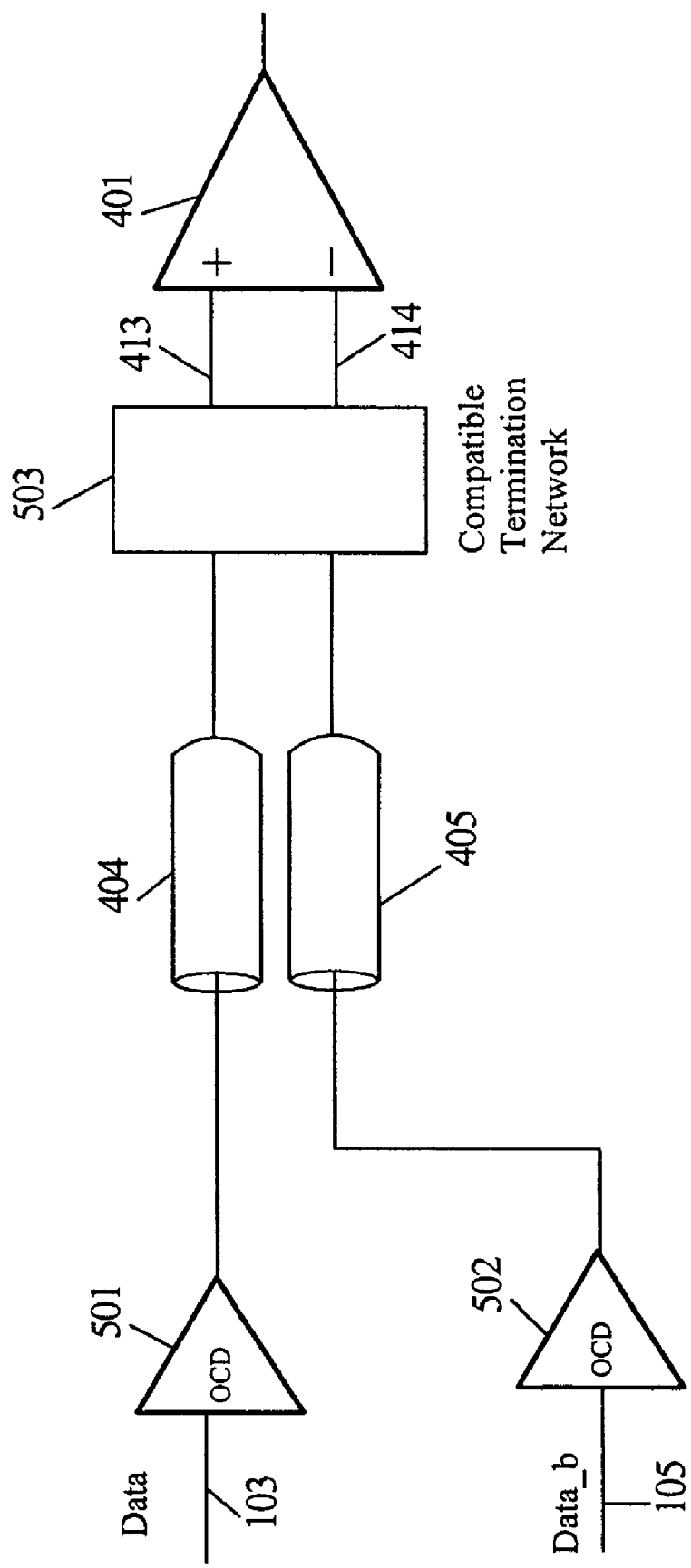
FIG. 5 is a circuit diagram illustrates a true-complement differential signaling.

FIG. 5 is a circuit diagram of true-complement data transmission using single ended drivers to realize differential signaling. Data 103 is coupled to off-chip driver (OCD) 501 and Data_b 105 is coupled to OCD 502. The output of OCD 501 drives transmission line 404 and output of OCD 502 drives transmission line 405. The transmission lines 404 and 405 are terminated in a compatible termination network 503 coupled to nodes 413 and 414 and the inputs of receiver 401. Data 103 transmits the true state of a logic signal and Data_b 105 transmits the complement of the logic signal. The circuit configuration 500 is used for differential signaling because single ended OCDs are generally easier to implement than true differential drivers.

Figure 6:
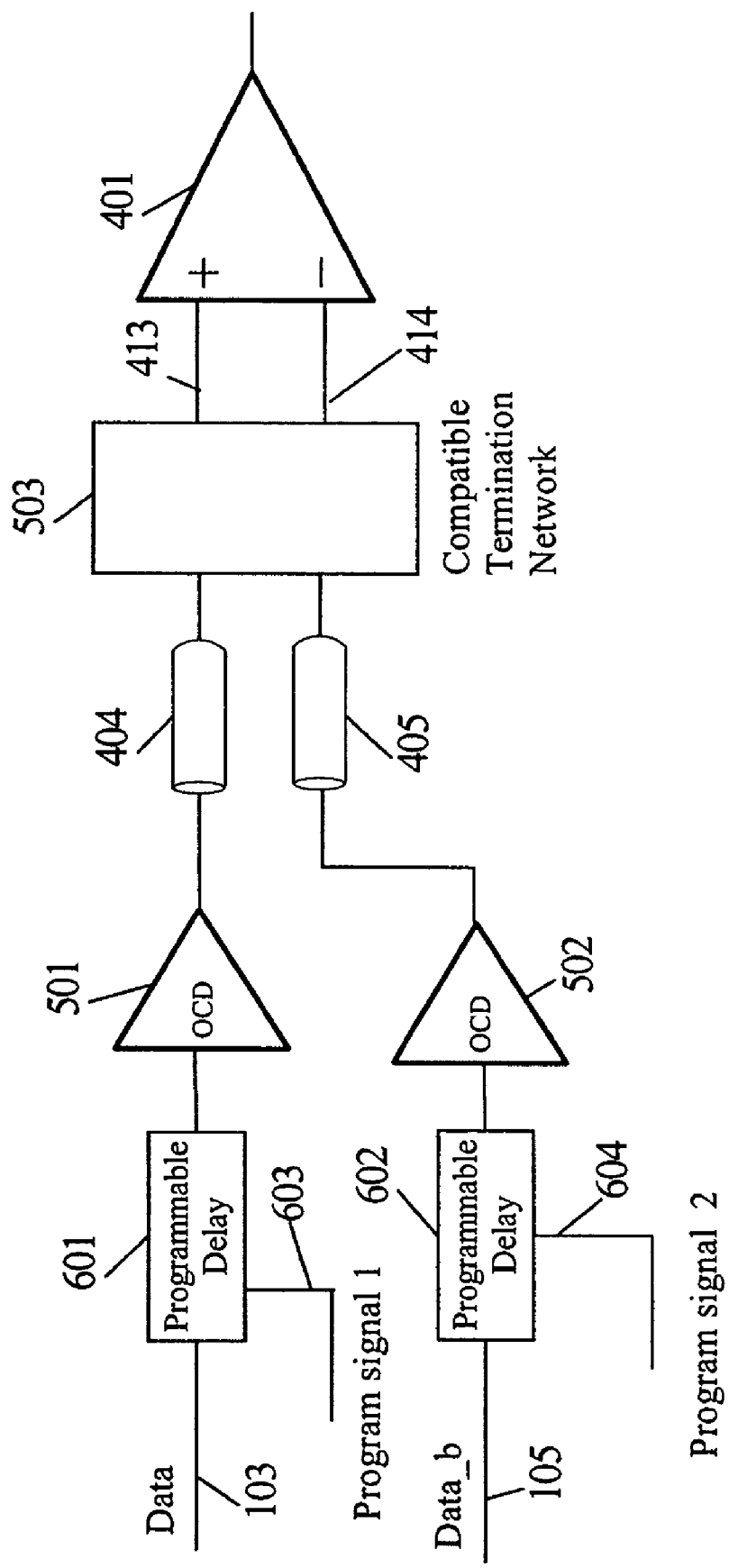
FIG. 6 is a circuit diagram illustrates a true-complement differential signaling with programmable delay according to embodiments of the present invention.

FIG. 6 is a circuit diagram of true-complement data transmission using single ended drivers where programmable delay elements 601 and 602 are inserted between the input signals Data 103 and Data_b 105, respectively. Programming signals 603 and 604 are used to set the insertion delay in each data channel. In this manner, the skew between the data channel transmitting Data 103 and the data channel transmitting Data_b 105 is adjusted so the signals arriving at nodes 413 and 414 may be phase or transition aligned.

Figure 7:
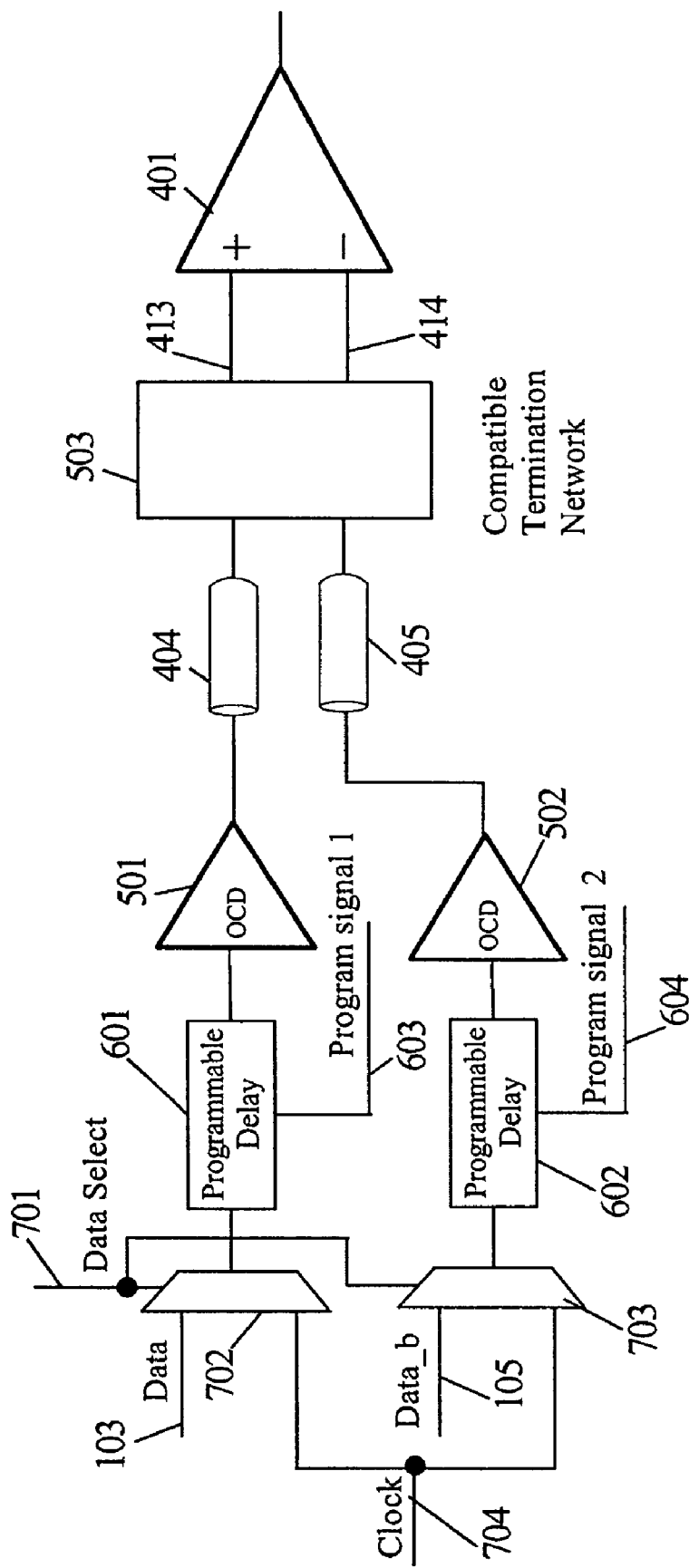
FIG. 7 is a circuit diagram illustrates a true-complement differential signaling with programmable delay and selectable input data according to embodiments of the present invention.

FIG. 7 is a circuit diagram of the circuit in FIG. 6 with the addition of a multiplexer (MUX) in each differential data channel to allow either a clock signal 704 or the data signals Data 103 and Data_b 105 to be transmitted to differential receiver 401. If the data channels are to be aligned, then data select 701 selects clock 704 as the input to both data channels. Since the same signal is transmitted over both data channels, then the inherent delay differences may be compensated by adjusting programmable delay elements 601 and 602. Initially, program signal 603 and delay select 604 may be programmed to set programmable delay elements 601 and 602 to one-half their maximum delays. This allows delay to be added or subtracted to compensate for either leading or lagging phase shifts between the data channels. The common clock signals are transmitted by OCDs 501 and 502 through transmission lines 404 and 405 respectively. Termination network 503 is configured to be compatible with the transmission lines and the drivers and receivers. The phase shift between the signals arriving at nodes 413 and 414 represents the time delay difference between the two data channels. Unless compensated for by adjusting the relative delays of programmable delay elements 601 and 602, the data channel timing skew will effect the signal quality of the signal generated on the output of differential receiver 401.

Figure 8:
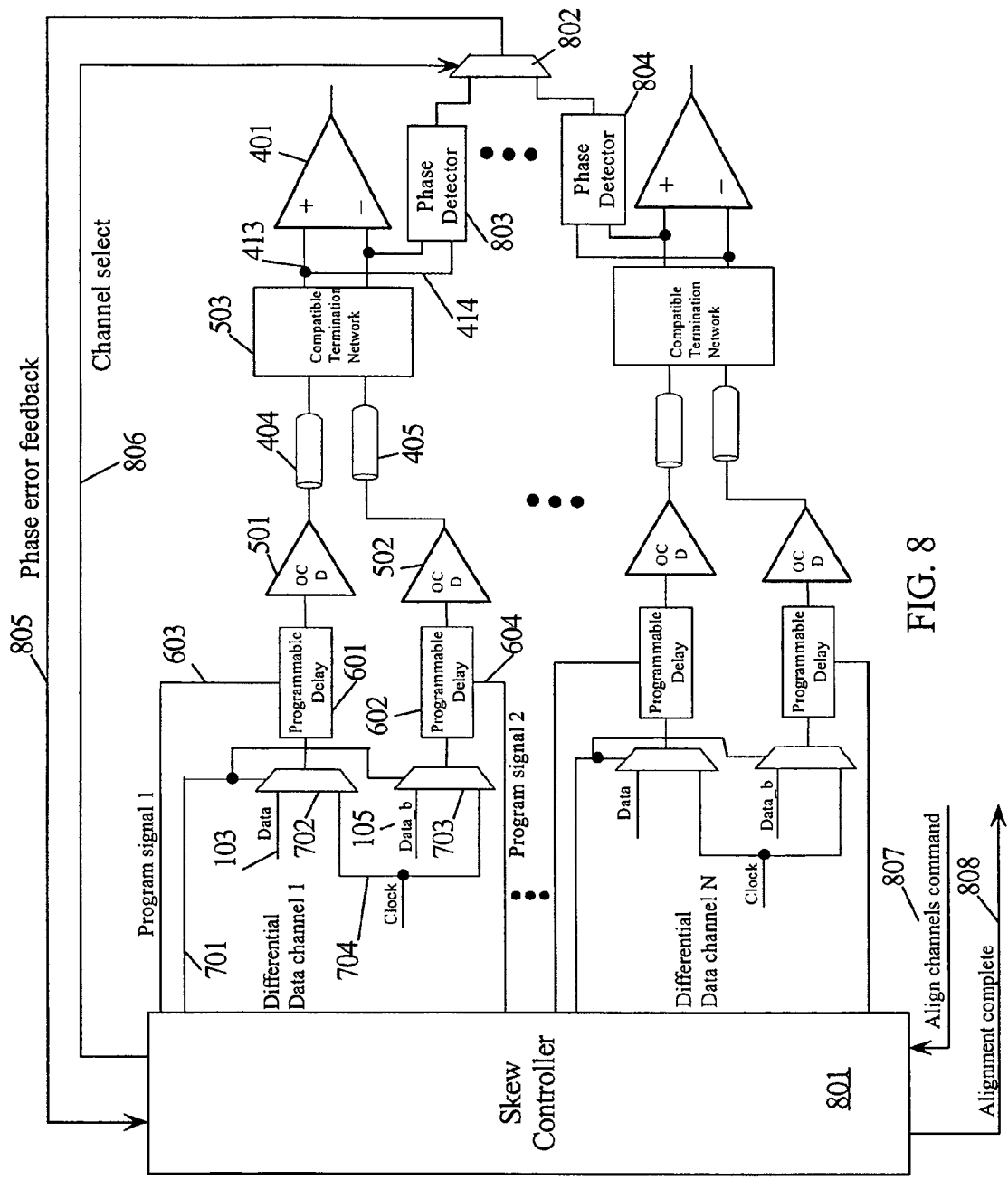
FIG. 8 is a circuit block diagram illustrating a system for aligning a N channel bus according to embodiments of the present invention.

FIG. 8 is a block diagram of a system for aligning N differential channels according to embodiments of the present invention. Skew controller 801 controls the channel skew alignment process. When align channels command 807 transitions to a logic one, skew controller 801 starts the alignment process by selecting differential data channel 1 for the alignment process. Control signal 701 selects clock 704 as the input to programmable delay elements 601 and 602 using MUXes 702 and 703. Likewise, control programming signals 603 and 604 set programmable delay elements 601 and 602 to a portion of their maximum delay (e.g., one-half). OCDs 501 and 502 drive the common clock signal 704 over transmission lines 404 and 405 where they are terminated by termination network 503 at nodes 413 and 414. Phase detector 803 generates logic states corresponding to the phase differences between the signals arriving at nodes 413 and 414. Skew controller 801 selects the output of phase detector 803 as the phase error feedback signal 805 using MUX 802. Depending on the number of outputs (P) necessary to determine the phase between the signals at nodes 413 and 414, MUX 802 is a P×N by P MUX. In one embodiment, phase detector 803 has two logic outputs with four logic states, thus MUX 802 would be a 2N×2 MUX.

Depending on the "value" of the phase error feedback signal 805, skew controller adjusts the delays of programmable delay elements 601 and 602 until the phase error feedback 805 indicates that the timing skew between the data channels in differential data channel 1 is within a predetermined minimum value. When this value is reached, the program values of program signals 603 and 604 are latched or held while the next channel is selected for alignment. Alignment continues until differential data channel N is aligned using phase detector 804. When the alignments are completed, then skew controller 801 signals to the system (e.g., system 1300) that bus alignment is complete and the system can switch to operation mode wherein actual data signals (e.g., Data 103 and Data_b 105) are transmitted between the driver side and the receiver.

Figure 9:
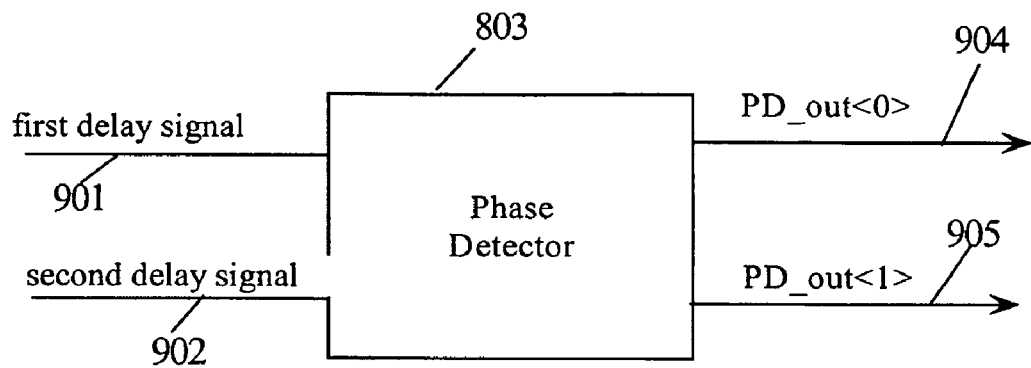
FIG. 9 is a circuit block diagram illustrating a phase detector output states according to embodiments of the present invention.

FIG. 9 is a block diagram of an exemplary phase detector 803 illustrating the logic states of the two outputs PD_out 904 and PD_out 905. Phase detectors are known in the art and may be tailored to meet the requirements of skew controller 801. In one embodiment, phase detector 803 has two digital outputs representing four logic states as follows:

State 1: first delay signal 901 lags second delay signal 902 and PD_out 904 is a logic 1 and PD_out 905 is a logic 0.

State 2: first delay signal 901 leads second delay signal 902 and PD_out 904 is a logic 0 and PD_out 905 is a logic 1.

State 3: first delay signal 901 is in phase with second delay signal 902 and PD_out 904 is a logic 1 and PD_out 905 is a logic 1.

State 4: the phase difference between first delay signal 901 and second delay signal 902 is indeterminate and PD_out 904 is a logic 0 and PD_out 905 is a logic 0.

It is understood that other phase detector states may be used that are compatible with a skew controller 801 and still be within the scope of the present invention.

Figure 10:
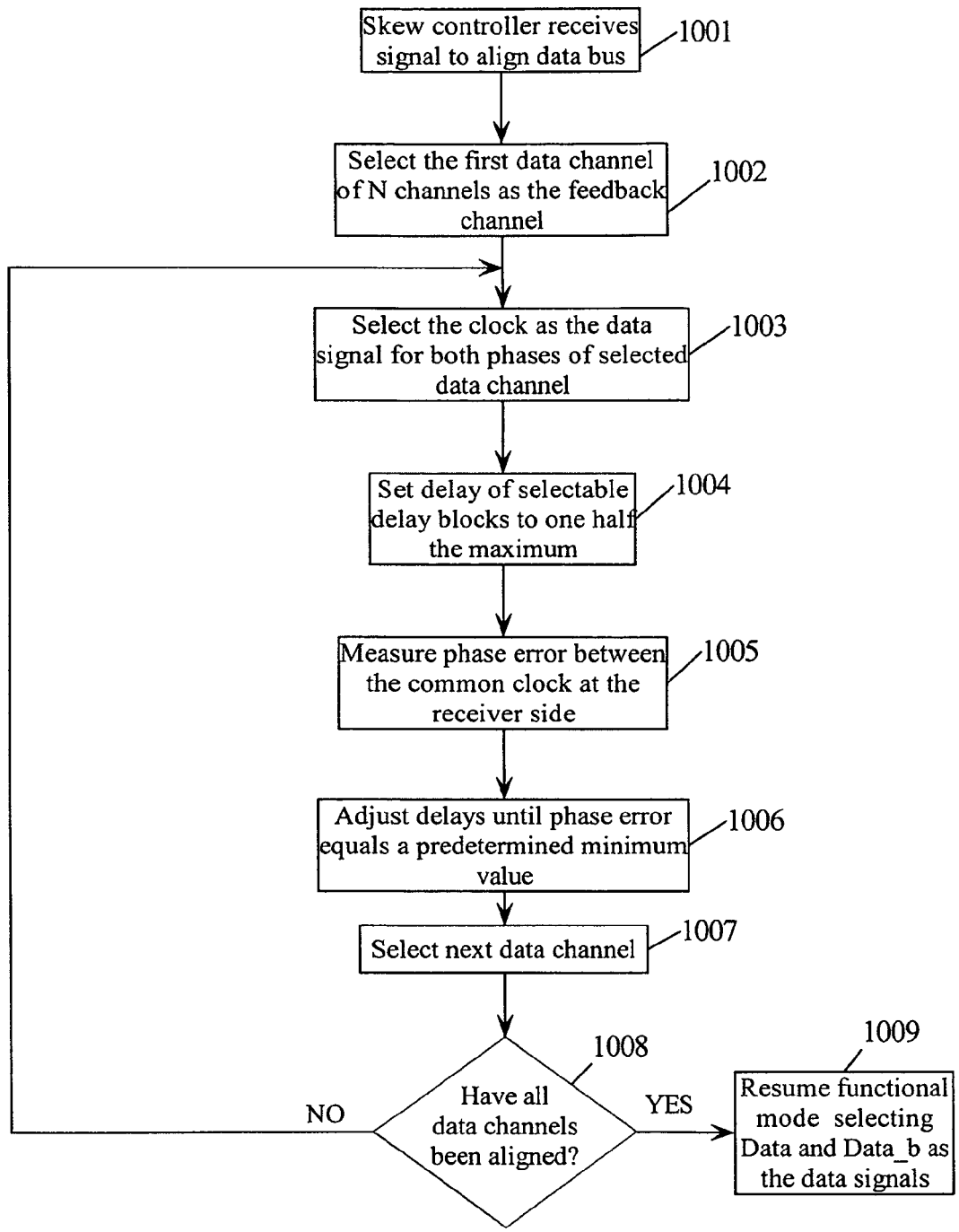
FIG. 10 is a flow diagram of method steps employed to align N differential data channels according to embodiments of the present invention.

FIG. 10 is a flow diagram of method steps used in embodiments of the present invention. In step 1001, skew controller 801 receives a align channels command 807 from the system employing embodiments of the present invention. In step 1002, controller 801 selects the differential data channel 1 to align. In step 1003, the clock 704 is selected as the input to both of the data channels and phase detector 803 is selected to provide the phase error feedback signal 805. In step 1004, the delays of programmable delay elements 601 and 602 are set to one-half their maximum delay. The phase error is measured in step 1005 and in step 1006, the delays in programmable delay elements 601 and 602 are adjusted until phase error feedback indicates the phase error is within a predetermined minimum value. The program inputs setting the delays in the preceding data channels are latched. In step 1007, the next differential data channel is selected. In step 1008, a test is done to determine if all channels have been aligned. If all channels have been aligned, then in step 1009 a functional mode is resumed by selecting Data 103 and Data_b 105 as the transmitted data signals. If all the differential data channels have not been aligned, then a branch is taken back to step 1003.

Figure 11:
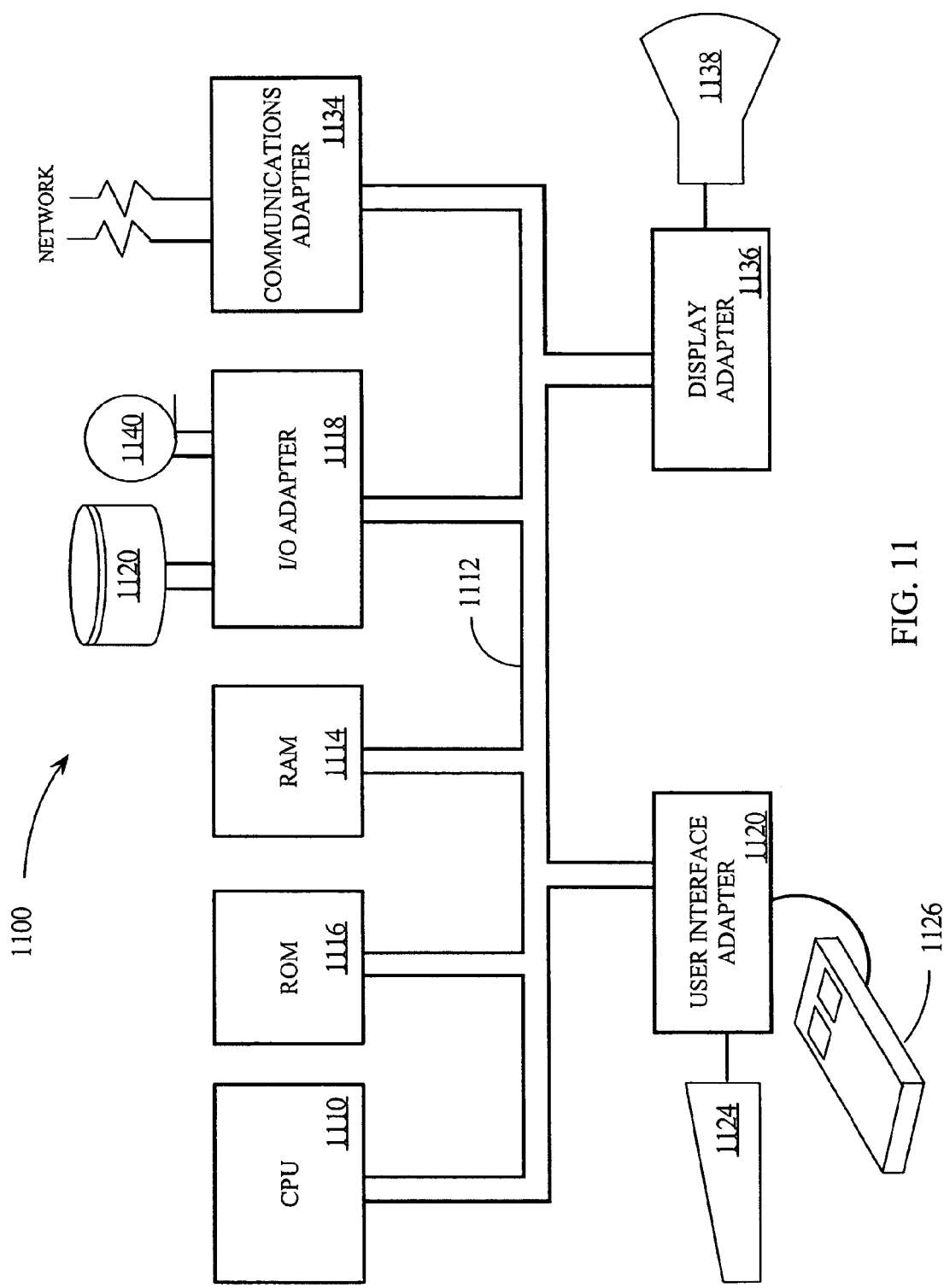
FIG. 11 is a block diagram a data processing system suitable for practicing embodiments of the present invention.

FIG. 11 is a high level functional block diagram of a representative data processing system 1100 suitable for practicing the principles of the present invention. Data processing system 1100 includes a central processing system (CPU) 1110 operating in conjunction with a system bus 1112. System bus 1112 operates in accordance with a standard bus protocol, such as the ISA protocol, compatible with CPU 1110. CPU 1110 operates in conjunction with electronically erasable programmable read-only memory (EEPROM) 1116 and random access memory (RAM) 1114. Among other things, EEPROM 1116 supports storage of the Basic Input Output System (BIOS) data and recovery code. RAM 1114 includes, DRAM (Dynamic Random Access Memory) system memory and SRAM (Static Random Access Memory) external cache. I/O Adapter 1118 allows for an interconnection between the devices on system bus 1112 and external peripherals, such as mass storage devices (e.g., a hard drive, floppy drive or CD/ROM drive), or a printer 1140. A peripheral device 1120 is, for example, coupled to a peripheral control interface (PCI) bus, and I/O adapter 1118 therefore may be a PCI bus bridge. User interface adapter 1122 couples various user input devices, such as a keyboard 1124 or mouse 1126 to the processing devices on bus 1112. Display 1138 which may be, for example, a cathode ray tube (CRT), liquid crystal display (LCD) or similar conventional display units. Display adapter 1136 may include, among other things, a conventional display controller and frame buffer memory. Data processing system 1100 may be selectively coupled to a computer or telecommunications network 1141 through communications adapter 1134. Communications adapter 1134 may include, for example, a modem for connection to a telecom network and/or hardware and software for connecting to a computer network such as a local area network (LAN) or a wide area network (WAN). CPU 1110 and other components of data processing system 1100 may contain logic circuitry in two or more integrated circuit chips that are coupled with off-chip differential signaling. The timing skew between data channels of the differential data channels may be aligned using the system and method according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A system for adjusting the timing skew of a plurality of differential data channels comprising:

control circuitry for generating a channel select signal, an input data select signal and first and second programmable delay signals, wherein the first and second programmable delay signals are adjusted in response to a phase error feedback signal;

driver circuitry receiving first and second data signals and a clock signal and generating first and second delayed drive signals in response to the input data select signal and the first and second programmable delay signals;

a first transmission line channel coupling the first delayed drive signal to a first input of a differential receiver;

a second transmission line channel coupling the second delayed drive signal to a second input of the differential receiver; and receiver circuitry receiving the first and second delayed drive signals arriving at the first and second inputs of the differential receiver and generating the phase error feedback signal.

2. The system of claim 1, wherein the driver circuitry comprises;
a first programmable delay element having an input coupled to a first select signal and an output generating the first delayed drive signal in response to the first program data; and
a first multiplexer (MUX) having a first input coupled to the first data signal, a second input coupled to the clock signal and an output generating the first data signal as the first select signal in response to a first logic state of the input select signal and generating the clock signal as the first select signal in response to a second logic state of the input select signal 3. The system of claim 1, wherein the driver circuitry comprises;
a second programmable delay element having an input coupled to a second select signal and an output generating the second delayed drive signal in response to the second program data; and
a second MUX having a first input coupled to the second data signal, a second input coupled to the clock signal and an output generating the second data signal as the second select signal in response to the first logic state of the input select signal and generating the clock signal as the second select signal in response to the second logic state of the input select signal.

4. The system of claim 3, wherein the driver circuitry further comprises a first off-chip driver (OCD) having an input coupled to output of the first programmable delay element and an output coupled to an input of the first transmission line channel.

5. The system of claim 4, wherein the driver circuitry further comprises a second OCD having an input coupled to output of the second programmable delay element and an output coupled to an input of the second transmission line channel.

6. The system of claim 5, wherein the receiver circuitry comprises a phase detector having a first input coupled to the first input of the differential receiver, a second input coupled to the second input of the differential receiver and an output generating a phase error signal as a function of the time difference between transitions of the first delayed data signal and the second delayed data signal.

7. The system of claim 6, wherein the receiver circuitry comprises:
a third MUX having inputs coupled to phase error signals from the plurality of differential data channels and an output generating the phase error feedback signal by selecting one of the phase error signals in response to the channel select signal.

8. The system of claim 6, wherein the receiver circuitry further comprises a termination network coupled to the first and second receiver inputs thus providing a signal reference level and an impedance level compatible with the differential receiver and the characteristic impedance of the first and second transmission line channels.

9. The system of claim 1 further comprising circuitry for storing values of the first and second programmable delay signals for each of the plurality of differential data channels.

10. A method for aligning a number N differential signal channels each having a first transmission line channel for a data signal and a second transmission line channel for a complement of the data signal comprising:
a) selecting one of the N differential signal channels as a selected differential signal channel;
b) coupling a clock signal to an input of a first programmable delay element in series with an input of a first transmission line of the selected differential signal channel, wherein the first transmission line couples an output of a first driver to a first input of a differential receiver for the selected differential signal channel;
c) coupling the clock signal to an input of a second programmable delay element in series with an input of a second transmission line of the selected differential signal channel, wherein the second transmission line couples an output of a second driver to a second input of the differential receiver;
d) receiving a first delayed signal from an output of the first transmission line and a second delayed signal from an output of the second transmission line;
e) generating in receiver side circuitry a phase error signal as a function of a time difference between the arrival of the first delayed signal at the first input of the differential receiver for the selected differential signal channel and the arrival of the second delayed signal at the second input of the differential receiver for the selected differential signal channel;
f) adjusting delays of the first and second programmable delay elements until the phase error signal is a predetermined value;
(g) repeating steps a) through f) until the N differential channels are aligned.

11. The method of claim 10 further comprising the step of maintaining the delays of the first and second programmable delay elements in each of the N differential data channels during an operational mode of transmitting functional data over the N differential data channels.

12. The method of claim 10 further comprising the steps of:
coupling a data signal to the input of the first data channel of each of the N differential data channels; and
coupling a complement of the data to the input of the second data channel of each of the N differential data channels.

13. A data processing system comprising:
a central processing unit (CPU);
a random access memory (RAM) for storing data and instructions for the CPU; and
a bus for coupling the CPU and RAM with a plurality differential signal channels having a system for adjusting the timing skew of the plurality differential signal channels including control circuitry for generating a channel select signal, an input data select signal and first and second programmable delay signals, wherein the first and second programmable delay signals are adjusted in response to a phase error feedback signal, driver circuitry receiving first and second data signals and a clock signal and generating first and second delayed drive signals in response to the input data select signal and the first and second programmable delay signals, a first transmission line channel coupling the first delayed drive signal to a first input of a differential receiver, a second transmission line channel coupling the second delayed drive signal to a second input of the differential receiver, and receiver circuitry receiving the first and second delayed drive signals arriving at the first and second inputs of the differential receiver and generating the phase error feedback signal.

14. The data processing system of claim 13, wherein the driver circuitry comprises;
   a first programmable delay element having an input coupled to a first select signal and an output generating the first delayed drive signal in response to the first program data; and
   a first multiplexer (MUX) having a first input coupled to the first data signal, a second input coupled to the clock signal and an output generating the first data signal as the first select signal in response to a first logic state of the input select signal and generating the clock signal as the first select signal in response to a second logic state of the input select signal 15. The data processing system of claim 13, wherein the driver circuitry comprises;
   a second programmable delay element having an input coupled to a second select signal and an output generating the second delayed drive signal in response to the second program data; and
   a second MUX having a first input coupled to the second data signal, a second input coupled to the clock signal and an output generating the second data signal as the second select signal in response to the first logic state of the input select signal and generating the clock signal as the second select signal in response to the second logic state of the input select signal.

16. The data processing system of claim 15, wherein the driver circuitry further comprises a first off-chip driver (OCD) having an input coupled to output of the first programmable delay element and an output coupled to an input of the first transmission line channel.

17. The data processing system of claim 16, wherein the driver circuitry further comprises a second OCD having an input coupled to output of the second programmable delay element and an output coupled to an input of the second transmission line channel.

18. The data processing system of claim 17, wherein the receiver circuitry comprises a phase detector having a first input coupled to the first input of the differential receiver, a second input coupled to the second input of the differential receiver and an output generating a phase error signal as a function of the time difference between transitions of the first delayed data signal and the second delayed data signal.

19. The data processing system of claim 18, wherein the receiver circuitry comprises:
   a third MUX having inputs coupled to phase error signals from the plurality of differential data channels and an output generating the phase error feedback signal by selecting one of the phase error signals in response to the channel select signal.

20. The data processing system of claim 18, wherein the receiver circuitry further comprises a termination network coupled to the first and second receiver inputs thus providing a signal reference level and an impedance level compatible with the differential receiver and the characteristic impedance of the first and second transmission line channels.

* * * * *